(12) United States Patent
Tagawa

(10) Patent No.: US 11,259,432 B2
(45) Date of Patent: Feb. 22, 2022

(54) CONNECTION STRUCTURE OF SHORT BAR AND LAND ON PRINTED CIRCUIT BOARD, AND MOTOR DRIVING APPARATUS

(71) Applicant: FANUC CORPORATION, Yamanashi (JP)

(72) Inventor: Takaaki Tagawa, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/878,618

(22) Filed: May 20, 2020

(65) Prior Publication Data

US 2020/0383226 A1     Dec. 3, 2020

(30) Foreign Application Priority Data

May 29, 2019   (JP) .............................. JP2019-100321

(51) Int. Cl.
| | |
|---|---|
| *H05K 7/00* | (2006.01) |
| *H05K 7/14* | (2006.01) |
| *H05K 1/02* | (2006.01) |
| *H01R 9/18* | (2006.01) |
| *H05K 1/18* | (2006.01) |
| *H05K 1/14* | (2006.01) |
| *H05K 1/11* | (2006.01) |

(52) U.S. Cl.
CPC ............. *H05K 7/1427* (2013.01); *H01R 9/18* (2013.01); *H05K 1/0213* (2013.01); *H05K 1/11* (2013.01); *H05K 1/145* (2013.01); *H05K 1/18* (2013.01)

(58) Field of Classification Search
CPC ...... H05K 7/1427; H05K 1/0213; H05K 1/11; H05K 1/145; H05K 1/18; H01R 9/18
See application file for complete search history.

(56) References Cited

U.S. PATENT DOCUMENTS

| | | | | |
|---|---|---|---|---|
| 1,872,616 | A | * 8/1932 | Birger ................... | F16B 37/065 411/183 |
| 4,753,615 | A | * 6/1988 | Weidler ............... | H01R 25/142 439/775 |
| 6,302,709 | B1 | * 10/2001 | Ross ....................... | H01R 4/34 439/78 |

(Continued)

FOREIGN PATENT DOCUMENTS

JP            2573531 B2     1/1997

OTHER PUBLICATIONS

JP 2019129277 A English Translation (Year: 2019).*
JP 10-12293 English Translation (Year: 1998).*

*Primary Examiner* — Pete T Lee
(74) *Attorney, Agent, or Firm* — Hauptman Ham, LLP

(57) ABSTRACT

A connection structure, of a short bar forming a conductive path and a land on a printed circuit board, in which the short bar includes a plate portion having a flat plate shape and a protrusion protruding in a stepped shape from a surface of the plate portion, the protrusion is threadably fastened to the printed circuit board by a screw inserted into a land-side through hole formed through the land, from an opposite side of the printed circuit board with respect to the protrusion, in a state where a flat surface portion formed, at a position spaced apart from the surface of the plate portion, on an outer surface of the protrusion is in close contact with the land.

10 Claims, 6 Drawing Sheets

(56) References Cited

U.S. PATENT DOCUMENTS

| | | | |
|---|---|---|---|
| 6,343,963 B1* | 2/2002 | Bronk | H01R 4/36 |
| | | | 439/11 |
| 6,866,456 B2* | 3/2005 | Bentrim | F16B 37/065 |
| | | | 411/353 |
| 7,766,703 B2* | 8/2010 | Carver | H01R 11/26 |
| | | | 439/801 |
| 2005/0134254 A1* | 6/2005 | Roden | G01R 1/203 |
| | | | 324/126 |
| 2008/0146092 A1* | 6/2008 | Taylor | H05K 3/325 |
| | | | 439/883 |

* cited by examiner

CONNECTION STRUCTURE OF SHORT BAR AND LAND ON PRINTED CIRCUIT BOARD, AND MOTOR DRIVING APPARATUS

RELATED APPLICATIONS

The present application claims priority to Japanese Application Number 2019-100321, filed May 29, 2019, the disclosure of which is hereby incorporated by reference herein in its entirety.

BACKGROUND OF THE INVENTION

1. Field of the Invention

The present invention relates to a connection structure of a short bar and a land on a printed circuit board, and a motor driving apparatus including the connection structure.

2. Description of the Related Art

There are cases where apparatuses such as motor driving apparatuses that handle large current use a conductive member referred to as a short bar as a member that forms a conductive path for supplying large current. JP 2573531 B describes a structure in which cylindrical conductors are fixed to a printed circuit board in a state where the cylindrical conductors penetrate through holes formed in the printed circuit board, and a short bar electrically connects the cylindrical conductors.

SUMMARY OF THE INVENTION

In a case where a short bar is connected to a land on a printed circuit board, there is a possibility that a desired contact area may not be ensured between the short bar and the printed circuit board unless the printed circuit board has a desired level of flatness.

According to an aspect of the present invention, there is provided a connection structure, of a short bar forming a conductive path and a land on a printed circuit board, in which the short bar includes a plate portion having a flat plate shape and a protrusion protruding in a stepped shape from a surface of the plate portion, the protrusion is threadably fastened to the printed circuit board by a screw inserted into a land-side through hole formed through the land, from an opposite side of the printed circuit board with respect to the protrusion, in a state where a flat surface portion formed, at a position spaced apart from the surface of the plate portion, on an outer surface of the protrusion is in close contact with the land.

According to another aspect of the present invention, there is provided a motor driving apparatus including a short bar and a printed circuit board connected by the connection structure, and a housing configured to house the short bar and the printed circuit board.

BRIEF DESCRIPTION OF THE DRAWINGS

The objects, features and advantages of the present invention will become more apparent from the description of the following embodiments in connection with the accompanying drawings, wherein.

DETAILED DESCRIPTION

Figure 1:
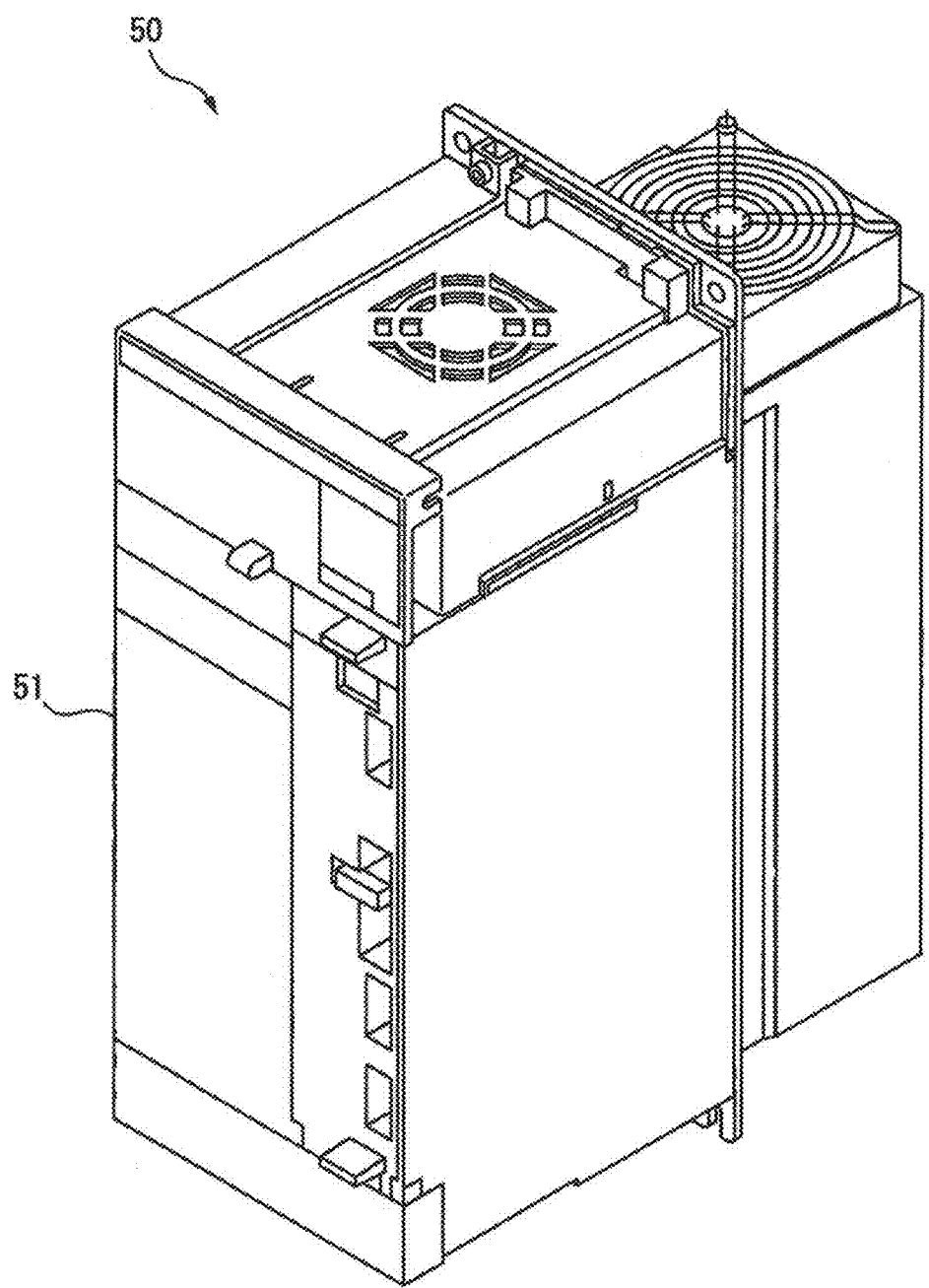
FIG. 1 is a perspective view illustrating an external appearance of a motor driving apparatus including a connection structure of a short bar and a land on a printed circuit board, according to an embodiment.

Embodiments of the present invention will be described below with reference to the accompanying drawings. Throughout the drawings, corresponding components are denoted by common reference numerals. For ease of understanding, these drawings are scaled as appropriate. The embodiments illustrated in the drawings are examples for implementing the present invention, and the present invention is not limited to the embodiments illustrated in the drawings.

FIG. 1 is a perspective view illustrating an external appearance of a motor driving apparatus 50 including a connection structure 10 of a short bar and a land on a printed circuit board (hereinafter referred to as connection structure 10) (see FIG. 2), according to an embodiment. The motor driving apparatus 50 is configured to drive a motor used in a machine tool, industrial robot, and the like. A housing 51 of the motor driving apparatus 50 houses, inside the housing 51, one or a plurality of a printed circuit board 20 on which various circuits necessary for driving the motor, such as a power source circuit, a motor drive circuit, and a motor control circuit, are mounted. Various connectors are disposed on the front face of the housing 51. The motor to be driven by the motor driving apparatus 50 is a high power motor that requires large current driving. The large current handled by the motor driving apparatus 50 is assumed to be a current from 100 A to 200 A, for example. The connection structure 10 according to the present embodiment reliably ensures a desired contact area between a short bar and a land of a printed circuit board, so as to reliably avoid the issue of heat generation that may occur when the desired contact area is not ensured.

Figure 2:
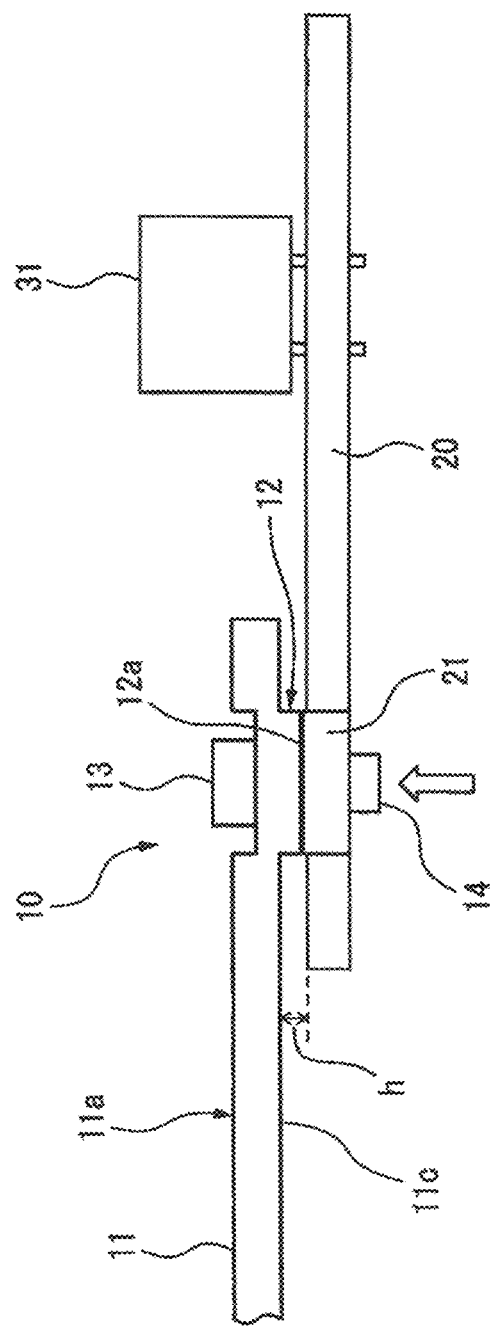
FIG. 2 is a side view schematically illustrating a connection structure of a short bar and a land on a printed circuit board.
Figure 3:
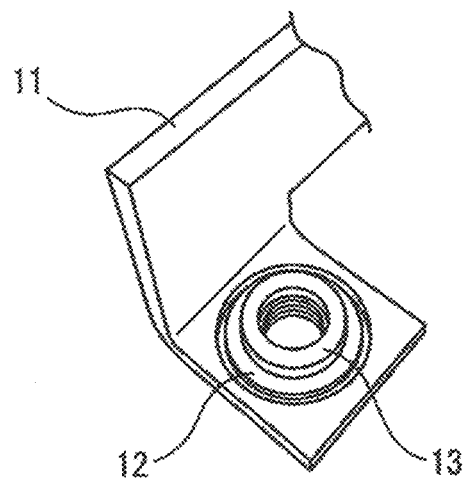
FIG. 3 is a perspective view from above of a portion where a protrusion of a short bar is formed.
Figure 4:
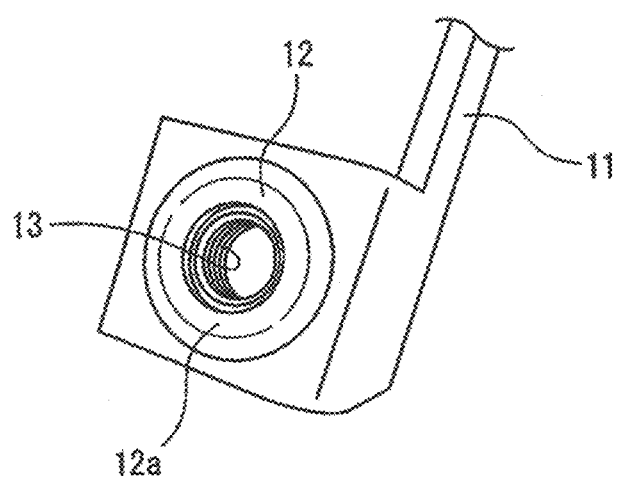
FIG. 4 is a perspective view from below of a portion where a short bar of a protrusion is formed.

FIG. 2 is a side view schematically illustrating the connection structure 10 of a short bar 11 that forms large current conductive path and a land 21 on the printed circuit board 20. The short bar 11 is formed by punch processing a metal plate material such as a copper plate, and can be formed to have various shapes depending on the usage form of the short bar 11. Accordingly, in the present specification, the reference sign 11 is used in common for the short bars constituting the connection structure 10. FIGS. 3 and 4 illustrate perspective views from above and below, respectively, of a portion where a protrusion 12 of the short bar 11 is formed.

As illustrated in FIGS. 2 to 4, the short bar 11 includes a plate portion 11a having a flat plate shape and the protrusion 12 protruding in a stepped shape from a surface 11c of the plate portion 11a. The protrusion 12 may be formed by half-punch. The protrusion 12 is threadably fastened to the printed circuit board 20 by a screw 14 inserted into a through hole 20c (see FIG. 5) formed through the land 21 from the opposite side of the printed circuit board 20 with respect to the protrusion 12, in a state where a flat surface portion 12a formed, at a position spaced apart from the surface 11c, on an outer surface of the protrusion 12 is in close contact with the land 21. The flat surface portion 12a is a flat surface substantially parallel to the surface 11c of the plate portion 11a. The protrusion 12 and the land 21 have circular shapes in the present embodiment (see FIGS. 3, 4, and 6), but may also have other shapes. The current supplied from the short bar 11 is supplied through the land 21 and a wiring pattern, for example, to a relay 31 which is mounted on the printed circuit board 20 and which switches large current.

Figure 5:
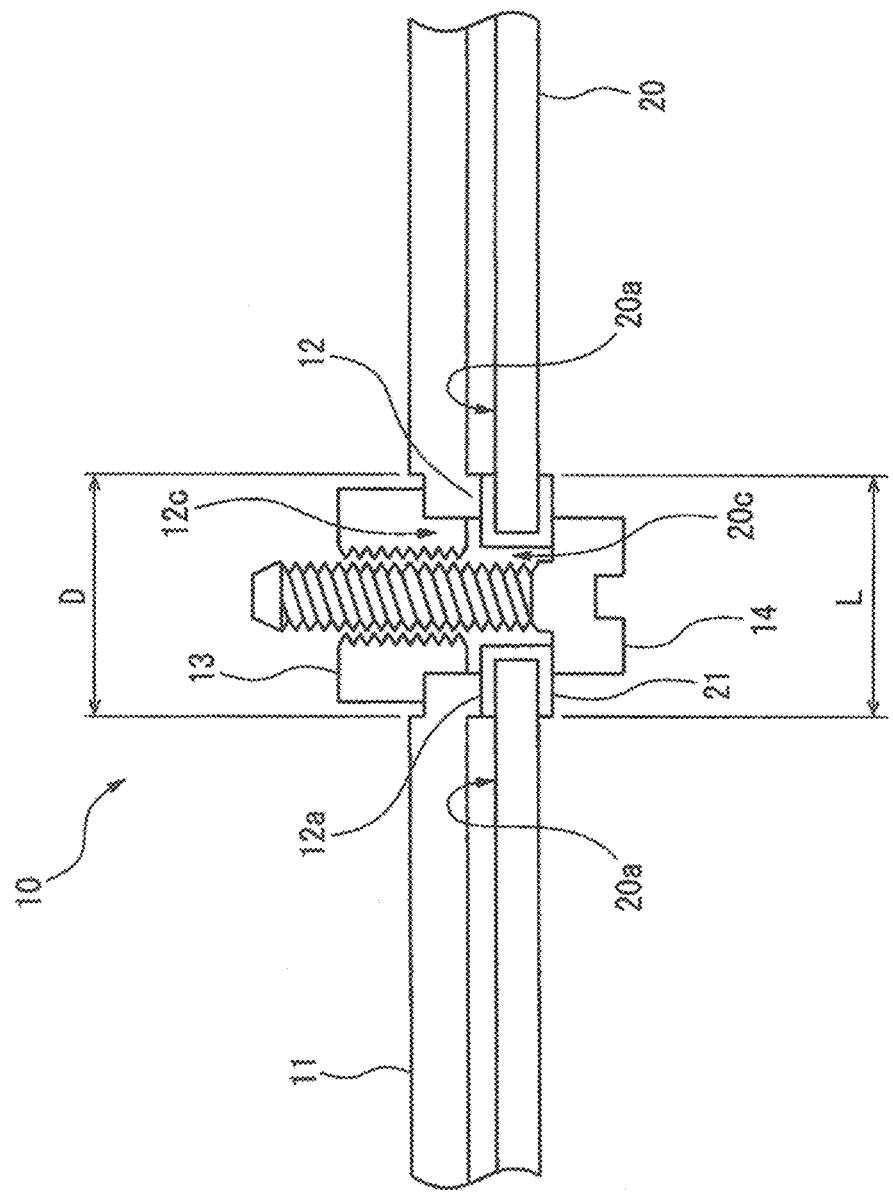
FIG. 5 is a view illustrating a cross-sectional structure that appears when a portion of a connection structure is cut by a plane containing a center line of a through hole of a land.

FIG. 5 is a view illustrating a portion of the connection structure 10 as a cross-sectional structure that appears when cut by a plane containing the center line of the through hole 20c. As illustrated in FIG. 5, a through hole 12c having a circular shape is formed in the protrusion 12 to be concentric with the protrusion 12 having a circular shape, and a press-fit nut 13 is press-fitted into the through hole 12c. The center line of a cylindrical inner circumferential surface of the press-fit nut 13 where a helical groove is formed coincides with the center line of the through hole 12c. As illustrated in FIG. 5, the flat surface portion 12a of the protrusion 12 is disposed to be in close contact with the land 21. In this state, the screw 14 inserted into the through hole 20c from the below of the printed circuit board 20 is screwed to the press-fit nut 13 such that the flat surface portion 12a is fixed to be in close contact with the land 21. While the thickness of the land 21 is illustrated with exaggeration from the perspective of ease of understanding in FIG. 5, the land is actually formed of copper foil, and the thickness of the land is significantly small compared to the height h of the protrusion 12 (see FIG. 2).

In the present embodiment, the outer diameter (maximum dimension) D of the flat surface portion 12a is set to be smaller than or equal to the outer diameter (maximum dimension) L of the land 21. This configuration ensures, in a region 20a around the land 21, a space corresponding to the height h in the protruding direction of the protrusion 12, in a state where the protrusion 12 of the short bar 11 is fixed to the printed circuit board 20. Such a configuration makes it possible to reliably bring the protrusions 12 into contact with the land 21, even in a circumstance where an unevenness of the resist occurs in the region 20a or a warpage of the printed circuit board 20 occurs, without being influenced by such a circumstance. Also, when the outer shapes of the flat surface portion 12a and the land 21 are other than the circular shape, the maximum dimension of the flat surface portion 12a is set to be smaller than or equal to the maximum dimension of the land 21, and the flat surface portion 12a is disposed to lie within the range of the land 21, so that the same advantageous effect as that described above can be achieved.

Figure 6:
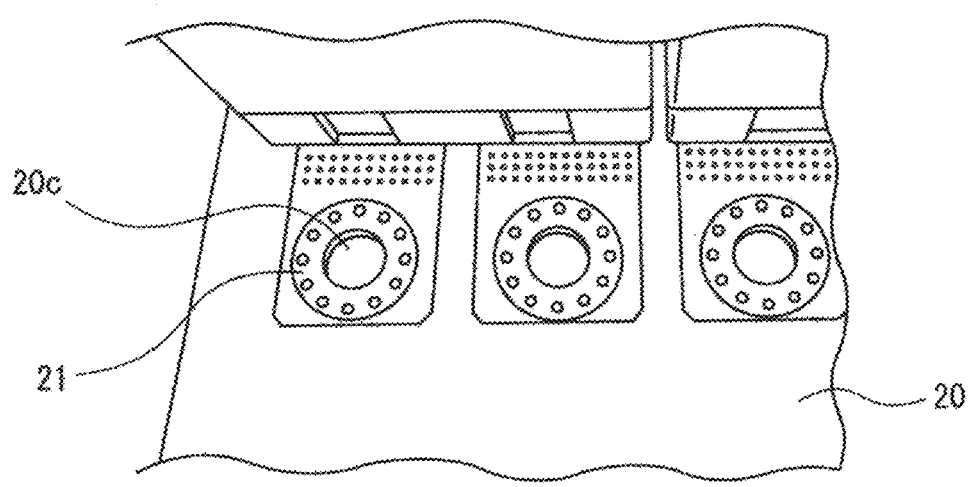
FIG. 6 is a perspective view from above of lands formed on a surface of a printed circuit board.
Figure 7:
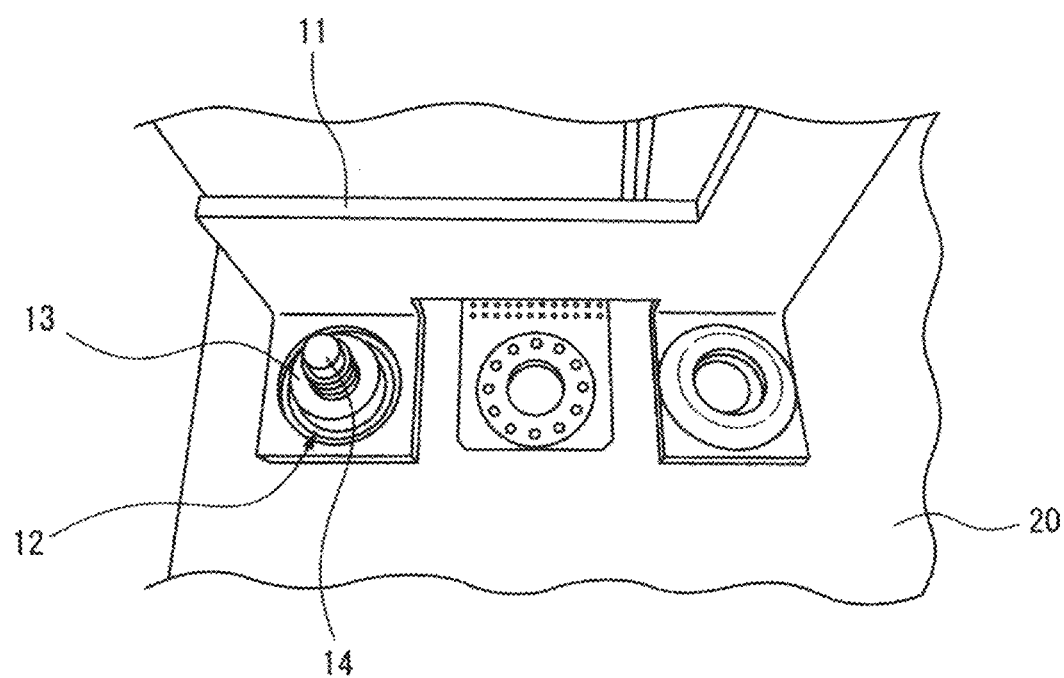
FIG. 7 is a perspective view from obliquely upward of a state where a protrusion of a short bar is connected to one of lands illustrated in FIG. 6.

FIG. 6 is a perspective view from above of the lands 21 formed on a surface of the printed circuit board 20. In the configuration example of FIG. 6, a resist layer is formed around each of the lands 21 having a circular shape. FIG. 7 is a perspective view from obliquely upward of a state where the protrusion 12 of the short bar 11 is connected to one of the lands 21 illustrated in FIG. 6.

Figure 8:
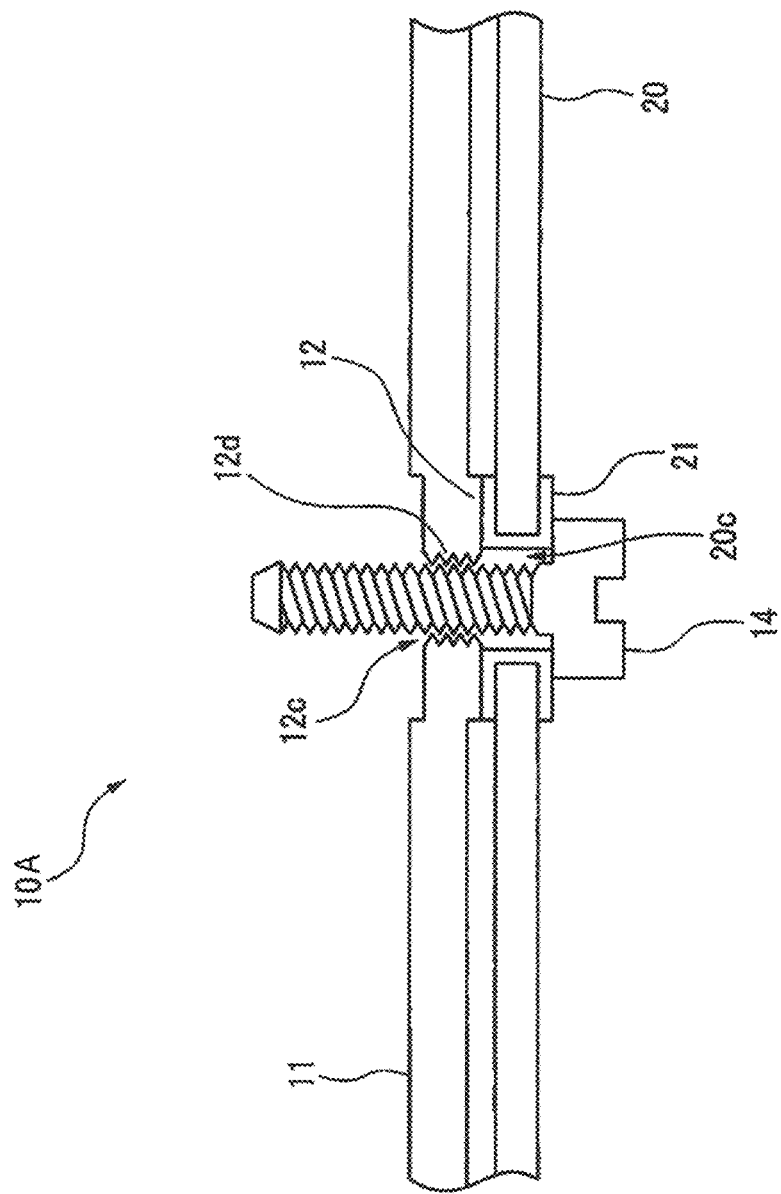
FIG. 8 is a view illustrating a cross-sectional structure that appears when a portion of a connection structure being a modified example is cut by a plane containing a center line of a through hole of a land.

In a configuration of the embodiment described above, the press-fit nut 13 is press-fitted to the protrusion 12 and the screw 14 is screwed into the press-fit nut 13, so as to ensure the strength of the screw fastening, however, as illustrated in FIG. 8, a helical groove may be formed on a cylindrical inner surface 12d forming the through hole 12c of the protrusion 12, and the screw 14 may be in threaded engagement with the helical groove on the inner surface 12d. FIG. 8 illustrates, as such a modified example, a portion of a connection structure 10A as a cross-sectional structure that appears when cut by a plane containing the center line of the through hole 20c. The structure shown in FIG. 8 does not need the press-fit nut 13, and is advantageous when the thickness of the short bar 11 is relatively large and the strength of the screw fastening is ensured.

According to the embodiment described above, a desired contact area can be reliably ensured between the short bar and the land on the printed circuit board. In particular, according to the present embodiment, it is possible to reliably ensure a desired contact area between the short bar and the printed circuit board, even when a flatness is not ensured due to various factors such as a warpage of the printed circuit board, an unevenness of the resist, and the like, without being influenced by the various factors.

While the invention has been described with reference to specific embodiments, it will be understood, by those skilled in the art, that various changes or modifications may be made thereto without departing from the scope of the claims described later.

The connection structures (10 and 10A) according to the embodiments described above can be applied to the connection between a short bar and a metal foil portion including a through hole, formed on a printed circuit board.

The invention claimed is:

1. A connection structure, of a short bar forming a conductive path and a land on a printed circuit board, wherein
the short bar includes a plate portion having a flat plate shape and a protrusion protruding in a stepped shape from a surface of the plate portion, and
the protrusion is threadably fastened to the printed circuit board by a screw inserted into a land-side through hole formed through the land, from an opposite side of the printed circuit board with respect to the protrusion, in a state where a flat surface portion formed, at a position spaced apart from the surface of the plate portion, on an outer surface of the protrusion is in close contact with the land.

2. The connection structure, of a short bar and a land on a printed circuit board, according to claim 1, wherein
a protrusion-side through hole is formed through the protrusion, and a press-fit nut is press-fitted into the protrusion-side through hole, and
the screw is in threaded engagement with the press-fit nut.

3. The connection structure, of a short bar and a land on a printed circuit board, according to claim 1, wherein
a protrusion-side through hole is formed through the protrusion, and a helical groove is formed on an inner surface having a cylindrical shape, the inner surface forming the protrusion-side through hole, and
the screw is in threaded engagement with the helical groove on the inner surface.

4. The connection structure, of a short bar and a land on a printed circuit board, according to claim 1, wherein
a maximum dimension of the flat surface portion of the protrusion is smaller than or equal to a maximum dimension of the land.

5. The connection structure, of a short bar and a land on a printed circuit board, according to claim 1, wherein the protrusion is a portion formed by half-punch processing with respect to the short bar.

6. A motor driving apparatus comprising:
a short bar and a printed circuit board connected by the connection structure according to claim 1; and
a housing configured to house the short bar and the printed circuit board.

7. The connection structure according to claim 1, wherein
the short bar extends in a direction perpendicular to an axial direction of the screw inserted into the land-side through hole.

8. The connection structure according to claim 1, wherein
the protrusion protrudes in a direction in parallel with an axial direction of the screw inserted into the land-side through hole.

9. The connection structure according to claim 1, wherein
a plane of the flat surface portion of the protrusion extends in a direction perpendicular to an axial direction of the screw inserted into the land-side through hole.

10. The connection structure according to claim 1, wherein
the short bar, the protrusion and the flat surface portion of the protrusion extend perpendicular to an axial direction of the screw inserted into the land-side through hole.

* * * * *